(12) United States Patent
Stautner

(10) Patent No.: US 11,384,883 B2
(45) Date of Patent: Jul. 12, 2022

(54) CRYOGENIC TRANSFER LINE COUPLING ASSEMBLY

(71) Applicant: General Electric Company, Schenectady, NY (US)

(72) Inventor: Ernst Wolfgang Stautner, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 390 days.

(21) Appl. No.: 16/778,836

(22) Filed: Jan. 31, 2020

(65) Prior Publication Data

US 2021/0239257 A1 Aug. 5, 2021

(51) Int. Cl.
*F16L 37/46* (2006.01)
*F16L 59/14* (2006.01)
(Continued)

(52) U.S. Cl.
CPC .............. *F16L 37/46* (2013.01); *F16L 59/141* (2013.01); *F16L 59/18* (2013.01);
(Continued)

(58) Field of Classification Search
CPC ......... F16L 59/141; F16L 59/18; F16L 37/46; F16L 37/367; F16L 37/107; F16L 37/24;
(Continued)

(56) References Cited

U.S. PATENT DOCUMENTS

| | | | |
|---|---|---|---|
| 2,317,827 A * | 4/1943 | Townhill | F16L 37/367 |
| | | | 137/614.01 |
| 2,399,516 A * | 4/1946 | Rush | F16L 37/12 |
| | | | 251/319 |

(Continued)

FOREIGN PATENT DOCUMENTS

| | | | |
|---|---|---|---|
| DE | 4219912 A1 * | 12/1993 | F16L 29/00 |
| DE | 4104711 C2 * | 8/1995 | F16L 39/005 |

(Continued)

OTHER PUBLICATIONS

Martin, et al., "A Transfer Line for Liquefied Gases", Advances in Cryogenic Engineering, 1960, vol. 1, p. No. 95-104, Springer, Boston, MA.

(Continued)

*Primary Examiner* — David Colon-Morales

(57) ABSTRACT

A cryogenic transfer line assembly and cryogenic transfer line coupling for a cryostat is presented. The cryogenic transfer line assembly includes an induction tube communicatively coupled to a cryostat, a cryogenic transfer line having defined as a portion thereof a second portion of a bayonet coupling and a cryogenic transfer line coupling, The cryogenic transfer line coupling communicatively couples the induction tube and the cryogenic transfer line and has defined as a portion thereof a first portion of the bayonet coupling and a gate valve. The gate valve prevents the ingress of environmental air passing through the first portion of the bayonet coupling to a cryogenic fluid disposed within a cryogenic vessel of the cryostat upon disengagement of the cryogenic transfer line from the cryogenic transfer line coupling.

20 Claims, 7 Drawing Sheets

(51) Int. Cl.
*G01R 33/38* (2006.01)
*F16L 59/18* (2006.01)
*H01F 6/04* (2006.01)
*G01R 33/3815* (2006.01)

(52) U.S. Cl.
CPC ...... *G01R 33/3804* (2013.01); *G01R 33/3815* (2013.01); *H01F 6/04* (2013.01)

(58) Field of Classification Search
CPC .. F16L 37/248; F16L 37/252; G01R 33/3804; G01R 33/3815; H01F 6/04; H01F 6/00
USPC .......................................................... 62/50.7
See application file for complete search history.

(56) References Cited

U.S. PATENT DOCUMENTS

| | | | | |
|---|---|---|---|---|
| 2,399,525 A * | 4/1946 | Waag | ............... | F16L 37/56 |
| | | | | 137/595 |
| 2,403,620 A * | 7/1946 | Rush | ............... | F16L 37/12 |
| | | | | 251/319 |
| 2,687,903 A * | 8/1954 | Zeeb | ............... | F16L 37/367 |
| | | | | 251/319 |
| 2,709,090 A * | 5/1955 | Zeeb | ............... | F16L 37/26 |
| | | | | 251/319 |
| 2,749,146 A * | 6/1956 | Gumbert | ............... | F16L 37/367 |
| | | | | 137/637.05 |
| 2,757,941 A * | 8/1956 | Zeeb | ............... | F16L 37/367 |
| | | | | 251/319 |
| 2,779,608 A * | 1/1957 | Abbey | ............... | F16L 37/46 |
| | | | | 251/149.1 |
| 2,828,146 A * | 3/1958 | Abbey | ............... | F16L 37/12 |
| | | | | 251/319 |
| 2,834,613 A * | 5/1958 | Rush | ............... | F16L 37/367 |
| | | | | 251/319 |
| 2,844,391 A * | 7/1958 | Albers | ............... | F16L 37/256 |
| | | | | 251/319 |
| 3,262,279 A | 7/1966 | Moore | | |
| 3,316,931 A | 5/1967 | Elrod | | |
| 3,332,446 A | 5/1967 | Mann | | |
| 3,348,386 A | 10/1967 | Forshee | | |
| 3,357,452 A * | 12/1967 | Middleton | ............... | F16L 37/367 |
| | | | | 251/367 |
| 3,383,875 A | 5/1968 | Haas | | |
| 3,433,028 A | 3/1969 | Klee | | |
| 3,546,917 A | 12/1970 | Paine | | |
| 3,719,200 A | 3/1973 | Draper et al. | | |
| 3,845,974 A * | 11/1974 | Pelloux-Gervais | ... | F16L 59/141 |
| | | | | 285/47 |
| 3,945,215 A * | 3/1976 | Johnson | ............... | F17D 1/082 |
| | | | | 62/50.7 |
| 4,011,732 A * | 3/1977 | Doherty | ............... | F16L 39/005 |
| | | | | 62/50.7 |
| 4,223,540 A * | 9/1980 | Longsworth | ............... | F25D 3/10 |
| | | | | 505/894 |
| 4,233,816 A | 11/1980 | Hensley | | |
| 4,275,763 A * | 6/1981 | Fahrig | ............... | F16K 3/029 |
| | | | | 137/613 |
| 4,302,943 A | 12/1981 | Niemann et al. | | |
| 4,306,705 A * | 12/1981 | Svensson | ............... | A61F 5/4405 |
| | | | | 604/905 |
| 4,635,450 A * | 1/1987 | Laskaris | ............... | H01F 6/065 |
| | | | | 62/51.1 |
| 4,635,451 A * | 1/1987 | Laskaris | ............... | F17C 9/00 |
| | | | | 251/339 |
| 4,813,244 A * | 3/1989 | Brzozowski | ............... | H01R 4/68 |
| | | | | 62/51.1 |
| 4,838,034 A | 6/1989 | Leonard et al. | | |
| 5,038,817 A * | 8/1991 | Henry | ............... | F04D 29/607 |
| | | | | 251/144 |
| 5,039,063 A * | 8/1991 | Louch | ............... | F16K 3/0281 |
| | | | | 251/328 |
| 5,165,439 A * | 11/1992 | Krynicki | ............... | F16K 17/40 |
| | | | | 137/39 |
| 5,385,026 A | 1/1995 | Zhang et al. | | |
| 5,417,073 A | 5/1995 | James et al. | | |
| 6,077,259 A * | 6/2000 | Caizza | ............... | A61M 39/14 |
| | | | | 604/905 |
| 6,116,278 A * | 9/2000 | Baumgardner | ......... | F16K 39/04 |
| | | | | 137/630.17 |
| 6,354,090 B1 | 3/2002 | Sengelin | | |
| 6,378,555 B2 * | 4/2002 | Kyle | ............... | F16L 37/46 |
| | | | | 137/613 |
| 6,858,280 B2 | 2/2005 | Allen et al. | | |
| 7,052,047 B1 * | 5/2006 | Box | ............... | F16L 59/184 |
| | | | | 62/50.7 |
| 7,453,041 B2 | 11/2008 | Maguire et al. | | |
| 7,546,744 B2 | 6/2009 | Harper et al. | | |
| 8,146,952 B2 | 4/2012 | Queau et al. | | |
| 8,267,433 B2 * | 9/2012 | Lange | ............... | F16L 59/182 |
| | | | | 62/50.7 |
| 8,517,749 B2 | 8/2013 | Marshall | | |
| 9,534,716 B2 | 1/2017 | Randrianarivony et al. | | |
| 9,612,062 B2 * | 4/2017 | Ri | ............... | F25B 1/00 |
| 9,897,350 B2 * | 2/2018 | Longsworth | ........ | G01R 33/3804 |
| 9,901,729 B2 * | 2/2018 | Vigna | ............... | F16L 37/367 |
| 9,958,520 B2 * | 5/2018 | Schauwecker | ......... | G01R 33/30 |
| 10,259,127 B2 * | 4/2019 | Bellandi | ............... | B25J 19/0033 |
| 2008/0169037 A1 * | 7/2008 | Ziegler | ............... | F16L 59/188 |
| | | | | 285/47 |
| 2011/0265494 A1 | 11/2011 | Barclay | | |
| 2012/0161052 A1 | 6/2012 | Randrianarivony et al. | | |
| 2012/0306492 A1 * | 12/2012 | Stautner | ............... | H01F 6/04 |
| | | | | 324/309 |
| 2018/0112829 A1 | 4/2018 | Popadiuc | | |

FOREIGN PATENT DOCUMENTS

| | | | | |
|---|---|---|---|---|
| GB | 2491463 A | * | 12/2012 | ......... G01R 33/3804 |
| GB | 2563426 B | * | 10/2019 | ............ F17C 13/006 |
| JP | 2003113973 A | * | 4/2003 | |
| WO | WO-8605568 A1 | * | 9/1986 | |
| WO | 2018228749 A1 | | 12/2018 | |
| WO | WO-2019225721 A | * | 11/2019 | ......... G01R 33/3815 |

OTHER PUBLICATIONS

Randall, et al., "A New Vacuum-Insulated Cryogenic Coupling", Advances in Cryogenic Engineering, 1965, p. No. 451-457, vol. 10, Springer, Boston, MA.

\* cited by examiner

CRYOGENIC TRANSFER LINE COUPLING ASSEMBLY

BACKGROUND

Embodiments of the present disclosure relate to cryostats and cryogenic fluid handling equipment and more particularly, to the coupling employed with a cryogenic transfer line.

Known cryostats containing liquid cryogens, for example are used to house superconducting magnets for magnetic resonance imaging (MRI) systems or nuclear magnetic resonance (NMR) imaging systems. Typically, the cryostat includes a helium vessel that surrounds a magnetic cartridge, where the magnetic cartridge includes a plurality of superconducting coils. Also, the helium vessel that surrounds the magnetic cartridge is typically filled with liquid helium for cooling the magnet. Additionally, a thermal radiation shield surrounds the helium vessel. Moreover, a vacuum vessel, surrounds the high temperature thermal radiation shield. In addition, the outer cryostat vessel is generally evacuated.

Cryogenic transfer lines are typically used for transferring cryogenic fluids between two cryogenic components, such as between the cryostat and a supply of cryogenic fluid. Typical cryogenic transfer lines, such as those often utilized in cryogenic systems, employ a bayonet coupling, also referred to as a Johnston coupling, at one or more ends of the cryogenic transfer line to enable removal or disengagement of the tubing line from the cryogenic component. In one embodiment, the transfer line includes a bayonet male part that is removed after the transfer of fluid, or cooldown, has been accomplished. Currently, human interaction is required for closing the cryogenic circuit that is open to environment for a short while after the male part of the coupling has been removed. Due to the circuit being open to the environment, if this is not done quickly and reliably, and with care, air ingress into to the cryogenic circuit may occur. This ingress of environmental air typically results in the blocking of the tubing of the internal vacuum containment cooling structure of the cryogenic component requiring a complete system warmup.

It may therefore be desirable to develop a robust design for a cryogenic transfer line coupling that advantageously reduces, if not eliminates, the ingress of environmental air into the cryogenic circuit upon disengagement of the cryogenic transfer line, while enhancing the life span and operability of the cryogenic component.

BRIEF DESCRIPTION

In accordance with aspects of the present disclosure, a cryogenic transfer line coupling for a cryostat is presented. The cryogenic transfer line coupling includes a first portion of a bayonet coupling; and a gate valve communicatively coupled to the first portion of the bayonet coupling and operable to provide sealing of an opening therethrough the gate valve and prevent the ingress of environmental air passing through the first portion of the bayonet coupling to a cryogenic fluid disposed within a cryogenic vessel of the cryostat.

In accordance with another aspect of the present disclosure, a cryogenic transfer line assembly for a cryostat is presented. The cryogenic transfer line assembly includes an induction tube communicatively coupled to a cryostat, a cryogenic transfer line and a cryogenic transfer line coupling. The cryogenic transfer line has defined as a portion thereof a second portion of a bayonet coupling. At least a portion of the cryogenic transfer line is disposed within the induction tube. The cryogenic transfer line coupling communicatively couples the induction tube and the cryogenic transfer line and has defined as a portion thereof a first portion of the bayonet coupling and a gate valve. The gate valve provides sealing of an opening therethrough the gate valve and prevent the ingress of environmental air passing through the first portion of the bayonet coupling to a cryogenic fluid disposed within a cryogenic vessel of the cryostat upon disengagement of the cryogenic transfer line from the cryogenic transfer line coupling.

In accordance with yet another aspect of the present disclosure, a cryogenic system is presented. The system includes a superconducting magnet, a cryostat comprising a cryogenic vessel in which the superconducting magnet and a cryogenic fluid are contained and a cryogenic transfer line assembly communicatively coupled to the cryostat. The cryogenic transfer line assembly includes an induction tube communicatively coupled to the cryostat, a cryogenic transfer line and a cryogenic transfer line coupling. The cryogenic transfer line has defined as a portion thereof a second portion of a bayonet coupling. At least a portion of the cryogenic transfer line is disposed within the induction tube. The cryogenic transfer line coupling communicatively couples the induction tube and the cryogenic transfer line. The cryogenic transfer line coupling includes a first portion of the bayonet coupling and a gate valve.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the disclosure.

DRAWINGS

These and other features, aspects, and advantages of the present disclosure will become better understood when the following detailed description is read with reference to the accompanying drawings in which like characters represent like parts throughout the drawings, wherein.

Figure 1:
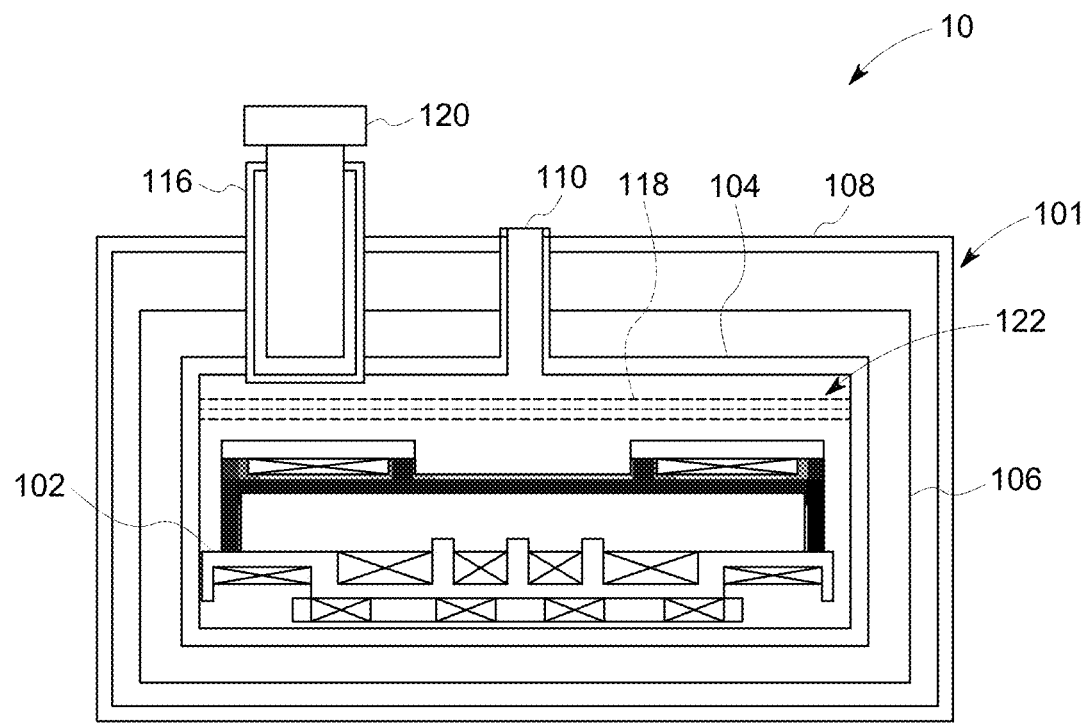
FIG. 1 is a partial cross-sectional view of a cryostat structure, in accordance with one embodiment of the present disclosure.

Repeat use of reference characters in the present specification and drawings is intended to represent the same or analogous features or elements of the embodiment shown.

DETAILED DESCRIPTION

As will be described in detail hereinafter, various embodiments of a cryogenic transfer line coupling for use in a cryostat and operable to seal the cryogenic circuit from the ingress of environmental air upon disengagement of the cryogenic transfer line are presented. Particularly, the various embodiments of the cryogenic transfer line coupling reduce the heat load to the cryostat caused during the disengagement of the cryogenic transfer line via a bayonet coupling by sealing the cryogenic circuit from the ingress of environment air. By employing the cryogenic transfer line coupling described hereinafter, cryostat heat loads caused by the ingress of environmental air may be dramatically reduced.

Referring to FIG. 1, a schematic sectional diagram of a helium bath cooled MRI cryogenic magnet system 10 illustrating a portion of an exemplary cryostat, and more particularly a cold box of the cryostat wall, 101 is depicted. The cryostat 101 includes a superconducting magnet 102. Moreover, the cryostat 101 includes a toroidal cryogenic vessel 104, which surrounds the superconducting magnet 102 and is filled with a cryogenic fluid 118 for cooling the magnets. The cryogenic vessel 104 may also be referred to as an inner wall of the cryostat 101. The cryostat 101 also includes a toroidal thermal radiation shield 106, which surrounds the cryogenic vessel 104. In addition, the cryostat 101 includes a toroidal vacuum vessel or outer vacuum chamber (OVC) 108, which surrounds the thermal radiation shield 106. The OVC may also be referred to as an outer wall of the cryostat 101. Furthermore, the cryostat 101 includes a single cryogenic transfer line coupling 110, which penetrates the cryogenic vessel 104, the outer vacuum chamber 108 and the thermal radiation shield 106, thereby providing access to a cryogenic circuit 122, and more particularly, the cryogenic fluid 118 within the cryogenic vessel 104 during cryogenic fluid transfer or a cooldown process. In the embodiment depicted in FIG. 1, each cryogenic transfer line coupling 110 is configured including a gate valve, as described herein and provides for the communicative coupling of a cryogenic transfer line and form a cryogenic transfer line assembly 100.

Moreover, the cryogenic fluid 118 in the cryostat 101 may include helium, in certain embodiments. However, in certain other embodiments, the cryogenic fluid 118 may include liquid hydrogen, liquid neon, liquid nitrogen, or combinations thereof. It may be noted that in the present application, the various embodiments are described with reference to helium as the cryogenic fluid 118. Accordingly, the terms cryogenic vessel and helium vessel may be used interchangeably.

Also, as depicted in FIG. 1, the system 10 includes a sleeve 116. In certain embodiments, a cryocooler 120 may be disposed in the sleeve 116. The cryocooler 120 is employed to cool the cryogenic fluid 118 in the cryogenic vessel 104.

Typically, cryogenic transfer line couplings potentially lead to an increase in the heat load to a cryostat from room temperatures to cryogenic temperatures due to the ingress of environmental air into the cryogenic circuit, reducing the transfer efficiency. In accordance with aspects of the present disclosure, one or more cryogenic transfer line couplings for use in a cryostat, such as the cryogenic transfer line coupling 110 for use in the cryostat 101 of FIG. 1, and configured to reduce the ingress of environmental air into the cryostat 101 upon disengagement of a cryogenic transfer line is presented. Particularly, the cryogenic transfer line coupling 110 presented hereinafter is configured to reduce the heat load to the cryostat 101 by forming a seal within the cryogenic transfer line coupling 110 so as to prevent the ingress of environmental air into the cryogenic circuit 122.

In the embodiment of FIG. 1, the helium bath cooled MRI magnet system requires only one port, and thus utilizes a single cryogenic transfer line coupling 110 as disclosed herein.

Figure 2:
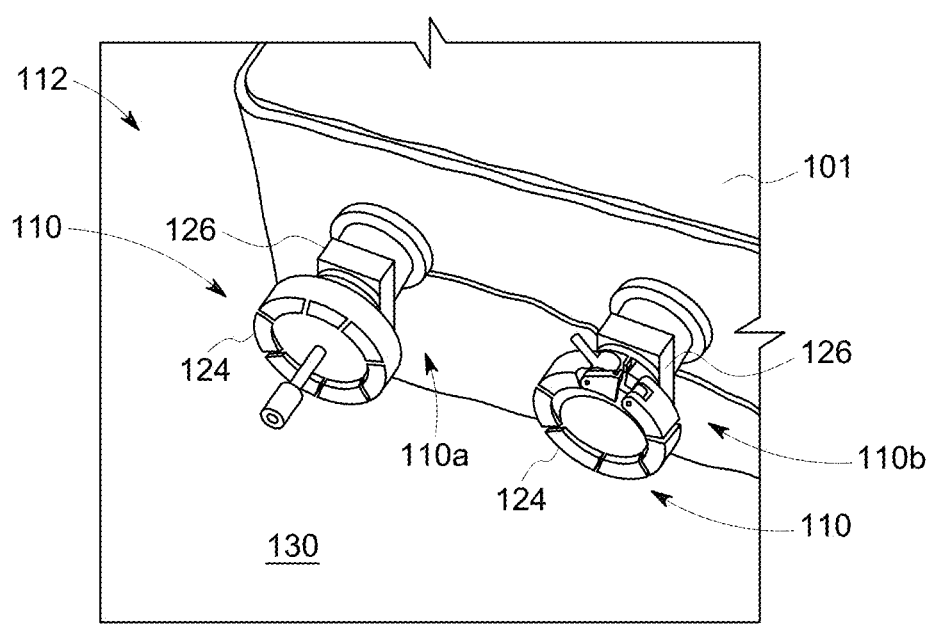
FIG. 2 is a partial cross-sectional view of a cryostat structure, in accordance with another embodiment of the present disclosure.

Illustrated in FIG. 2 is a schematic partial isometric view of another embodiment of portion of a cryostat 101, and more particularly a portion of a coldbox of a thermosiphon cooled MRI magnet system 112. As best illustrated in FIG. 2, each of the exemplary one or more cryogenic transfer line couplings 110 includes a portion of a bayonet coupling 124 and a gate valve 126 that is configured to minimize, if not eliminate, the ingress of environmental air into the cryostat 101, thereby aiding in reducing the heat load to the cryostat 101 caused during the disengagement of a cryogenic transfer line 128 (FIGS. 7 and 8) to each of the one or more cryogenic transfer line couplings 110.

In this particular embodiment, the thermosiphon cooled MRI magnet system does not require a helium bath to be filled, and thus cooldown is initiated from an external cooler (not shown) via the two transfer lines. More particularly, a feed line or inflow line and a return flow line are required for transferring pressurized cold vapor for a cooldown scenario. The return flow goes into a stand-alone vacuum chamber where the cryogen is cooled down, in light of the temperature difference being minimal, only 2 to 5 K for initial cooldown, e.g. forced helium flow goes in at 290 K and returns at 300 K. After a period of time, the forced helium flow goes in via the inflow line at 280 K and the return flow is at 290 K until operating temperature for magnet is reached. After cooldown, the transfer line is taken out and the cooldown tubes are evacuated through the gate valve. In this thermosiphon cooled MRI magnet system, the helium gas is circulated without any losses in the helium circuit. Once the magnet is cold, the helium is liquified from the gas tanks located within the cryostat and fill the thermosiphon tubes that keep the magnet cold.

Referring still to FIG. 2, illustrated are the cryogenic transfer line couplings 110, and more particularly, a cryogenic transfer line coupling 110a for the inflow transfer line and a cryogenic transfer line coupling 110b for the return transfer line, in accordance with one embodiment of the present disclosure. The cryogenic transfer line couplings 110 are disposed on one side of the cryostat 101. Subsequent to cold mass cooldown, a vacuum pump (not shown) is coupled to the cryogenic transfer line coupling 110a, the gate valve 126 is opened, and helium vapor is removed from the internal gas tubing (precool tubing) that surrounds the magnet cartridge. Subsequent to removal of the helium vapor, the gate valve 126 is closed. The cryogenic transfer line coupling 110a may also be referred to as a vacuum operator port. After this cooldown procedure, the gate valve 126 in the cryogenic transfer line coupling 110b remains closed.

Figure 3:
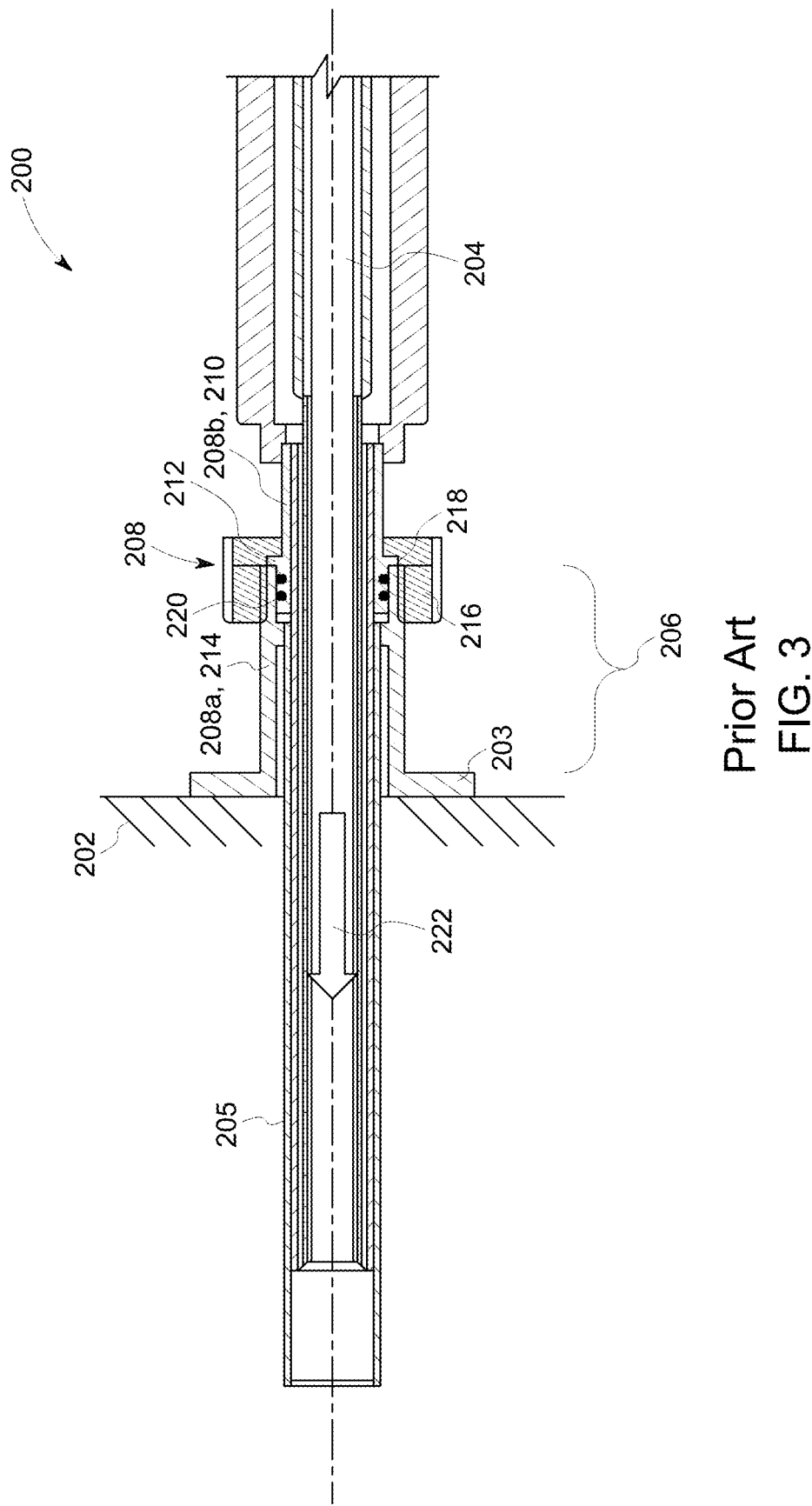
FIG. 3 is a schematic cross-sectional view of a known a cryogenic transfer line coupling.

Referring now to FIG. 3, illustrated is a schematic cross-sectional view of a portion of a known cryogenic transfer line assembly, generally referenced 200, illustrating coupling of a cryogenic transfer line thereto. More particularly, illustrated is a portion of a cryostat, and more particularly, a cold box of the cryostat wall, 202 generally similar to cryostat 101 of FIG. 1, a cryogenic transfer line 204 penetrating the cryostat 202, an induction tube 205 welded to an entry flange 203 of the cryostat 101 and a cryogenic transfer line coupling 206, coupling the cryogenic transfer line 204 to the wall of the cryostat 202. In this particular embodiment, the cryogenic transfer line 204 is coupled to the cryostat 202 via a bayonet coupling, generally referenced 208. Accordingly, the cryogenic transfer line coupling 206 comprises a first portion 208a of a bayonet coupling 208, configured as an at least partially threaded female receptor 214 of the bayonet coupling 208. The cryogenic transfer line 204 has formed as a part thereof, a second portion 208b of the bayonet coupling 208, configured as a generally cylindrical male portion 210, including one or more radial extending pins or protrusions, 212. During coupling of the cryogenic transfer line 204 to the cryostat 202, a generally nut-shaped component 216 of the cryogenic transfer line 204 is disposed relative to the female receptor 214 to form one or more L-shaped slot(s) 218 into which the protrusions 212 are cooperatively engaged. In an embodiment, one or more springs (not shown) may further keep the cylindrical male portion 210 and the female receptor 214 locked together. The bayonet coupling 208 may further include one or more sealing components 220, such as one or more O-rings, providing further sealing engagement of the cylindrical male portion 210 and the female receptor 214. In another embodiment, the female receptor may include L-shaped slot(s) into which the one or more radial protrusions of the cylindrical male side are engaged to keep the two parts locked together.

During the transfer of a cryogenic fluid 222, or cooldown, as previously described, human interaction is required to provide sliding of the cylindrical male portion 210 of the bayonet coupling 208 into the female receptor 214 and engagement of the protrusions 212. Subsequent to the transfer of the cryogenic fluid 222, or cooldown, and more particularly, disengagement of the cryogenic transfer line 204 from the cryostat 202, the cryogenic circuit within the cryostat 202, is open to environment for a short while after the cylindrical male portion 210 of the bayonet coupling 208, has been removed. Due to the cryogenic circuit being open to the environment, air ingress into to the cryogenic circuit typically occurs. This is due to the cold mass being is exposed to a large temperature gradient from room temperature down to the cold mass temperature e.g. 4 K. At this temperature range cryopumping of surfaces occur and hence air is pumped in through the open tubes.

Figure 4:
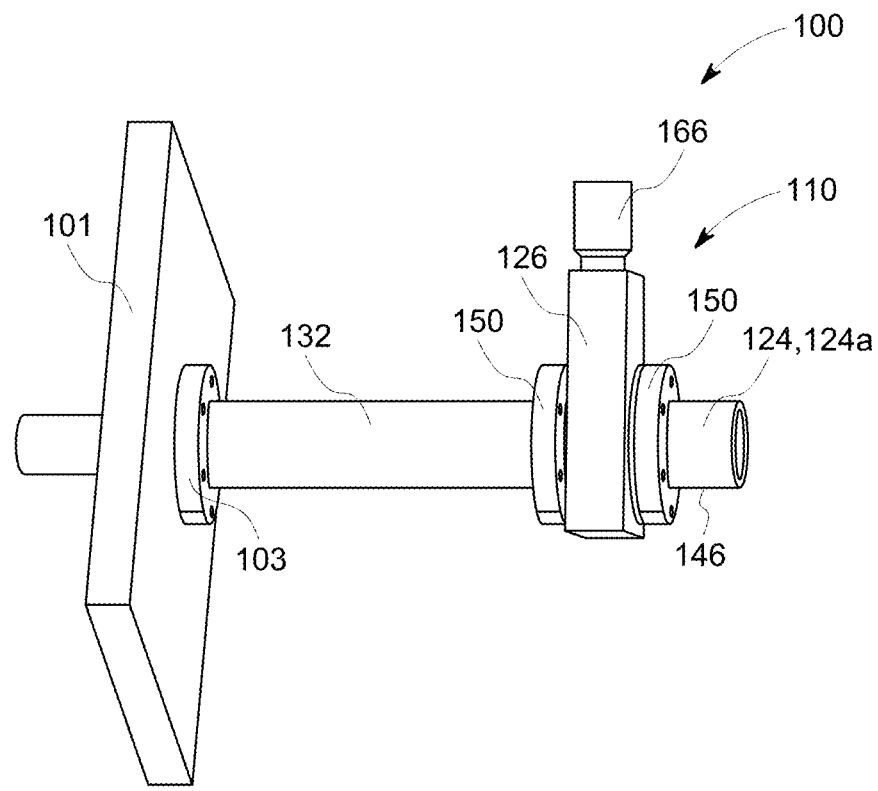
FIG. 4 is a schematic isometric view of the cryogenic transfer line coupling, in accordance with one embodiment of the present disclosure.
Figure 5:
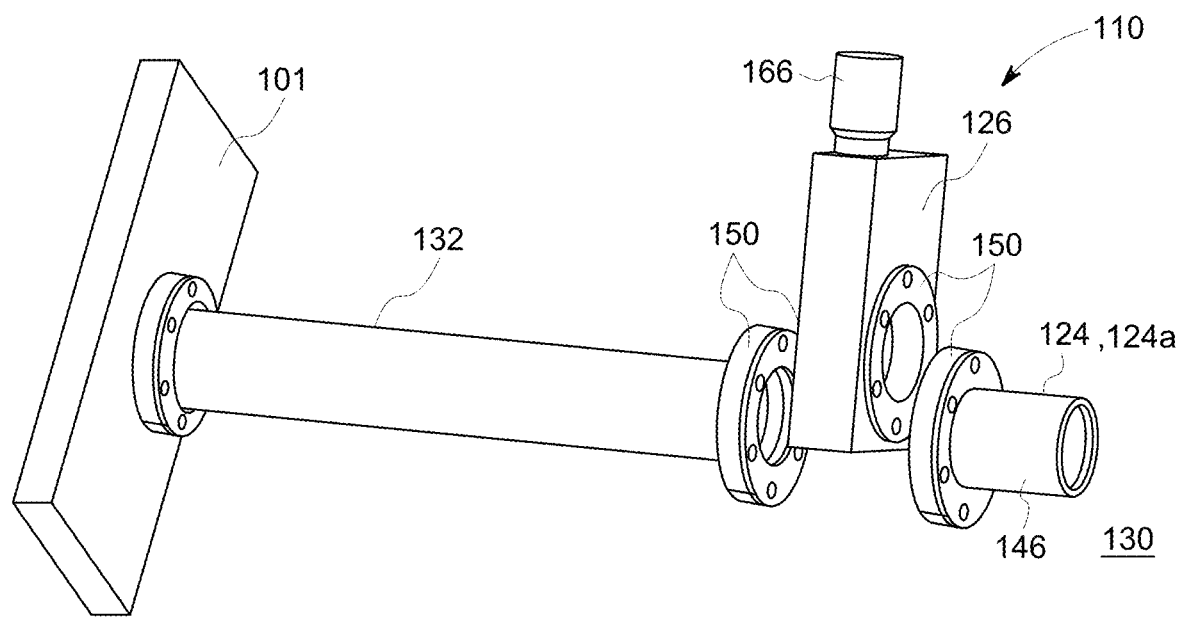
FIG. 5 is an exploded isometric view of the cryogenic transfer line coupling of FIG. 4, in accordance with one embodiment of the present disclosure.
Figure 6:
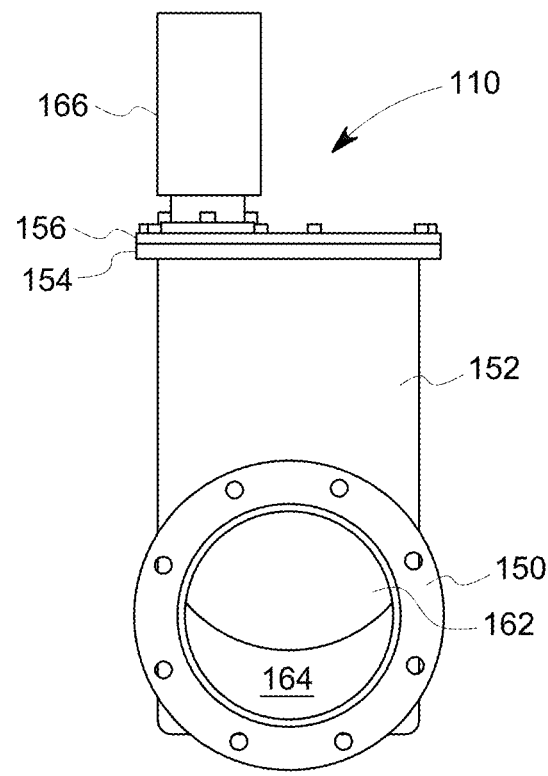
FIG. 6 is a schematic elevation view of a portion of the cryogenic transfer line coupling of FIG. 4, taken through line 6-6 of FIG. 7, in accordance with one embodiment of the present disclosure.
Figure 7:
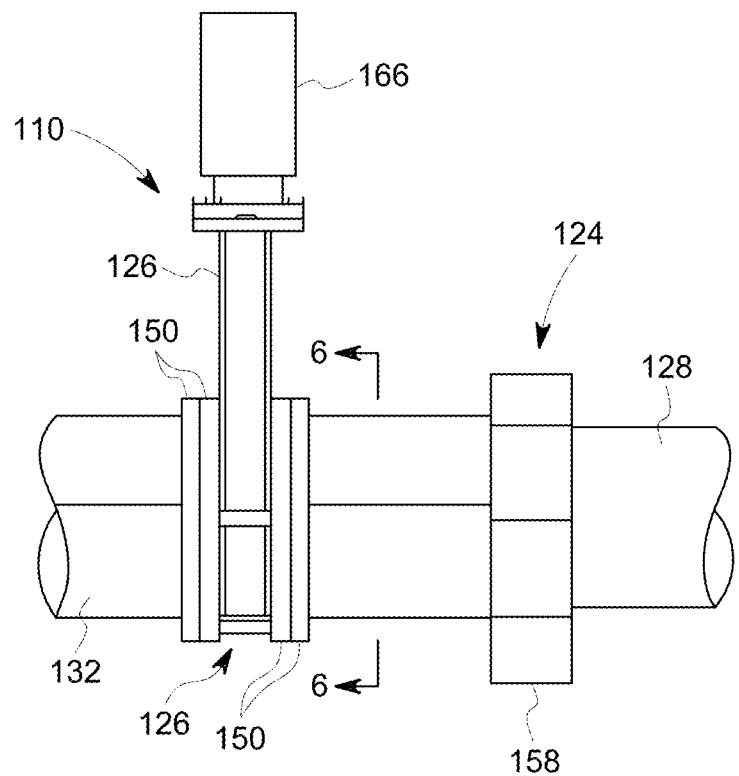
FIG. 7 is a schematic side view of a portion of the cryogenic transfer line coupling of FIG. 4, in accordance with one embodiment of the present disclosure.
Figure 8:
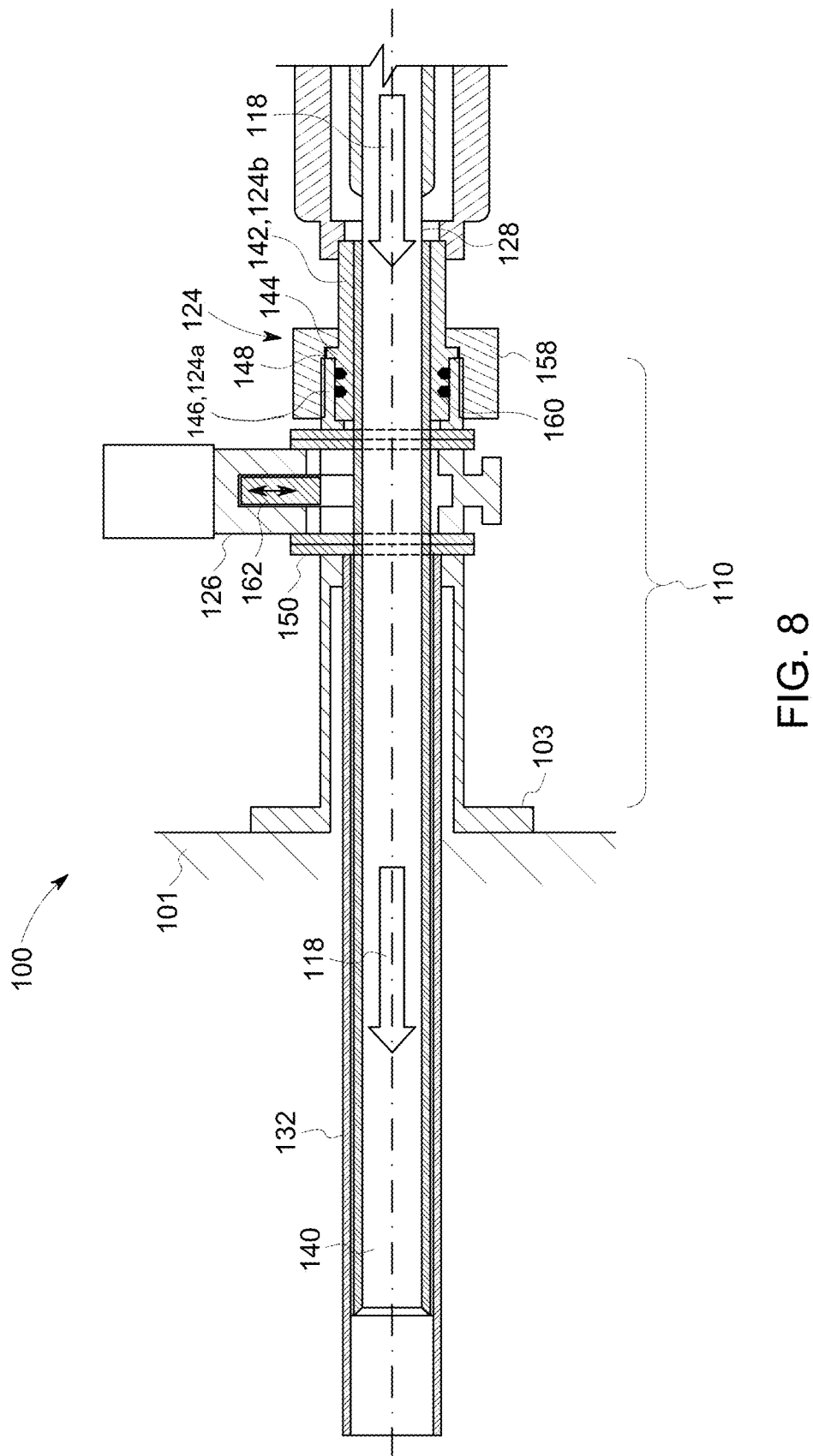
FIG. 8 is a schematic cross-sectional view of the cryogenic transfer line coupling of FIG. 4 in an open position, in accordance with one embodiment of the present disclosure.
Figure 9:
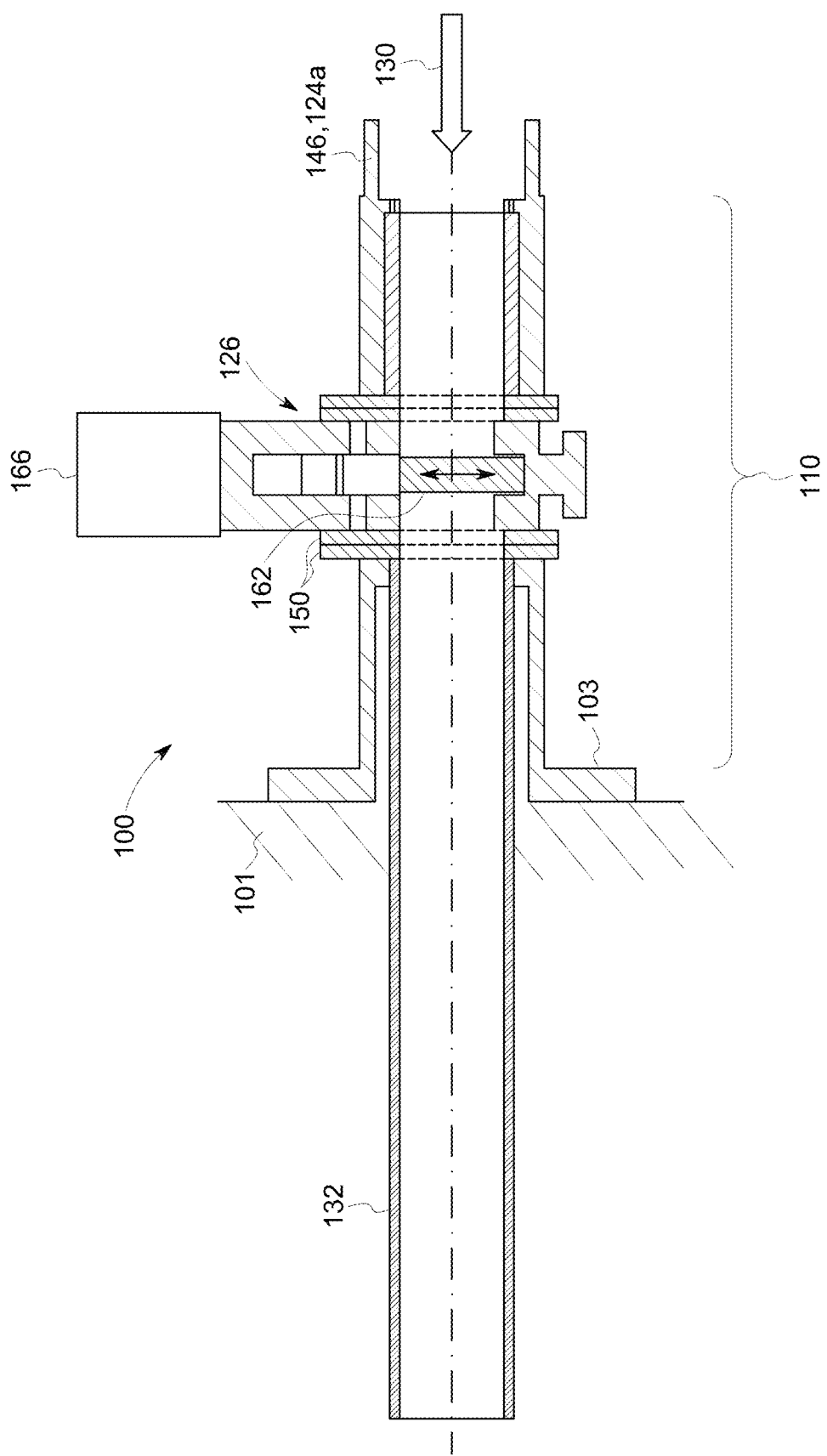
FIG. 9 is a schematic cross-sectional view of the cryogenic transfer line coupling of FIG. 4 in a closed position, in accordance with one embodiment of the present disclosure.
Figure 10:
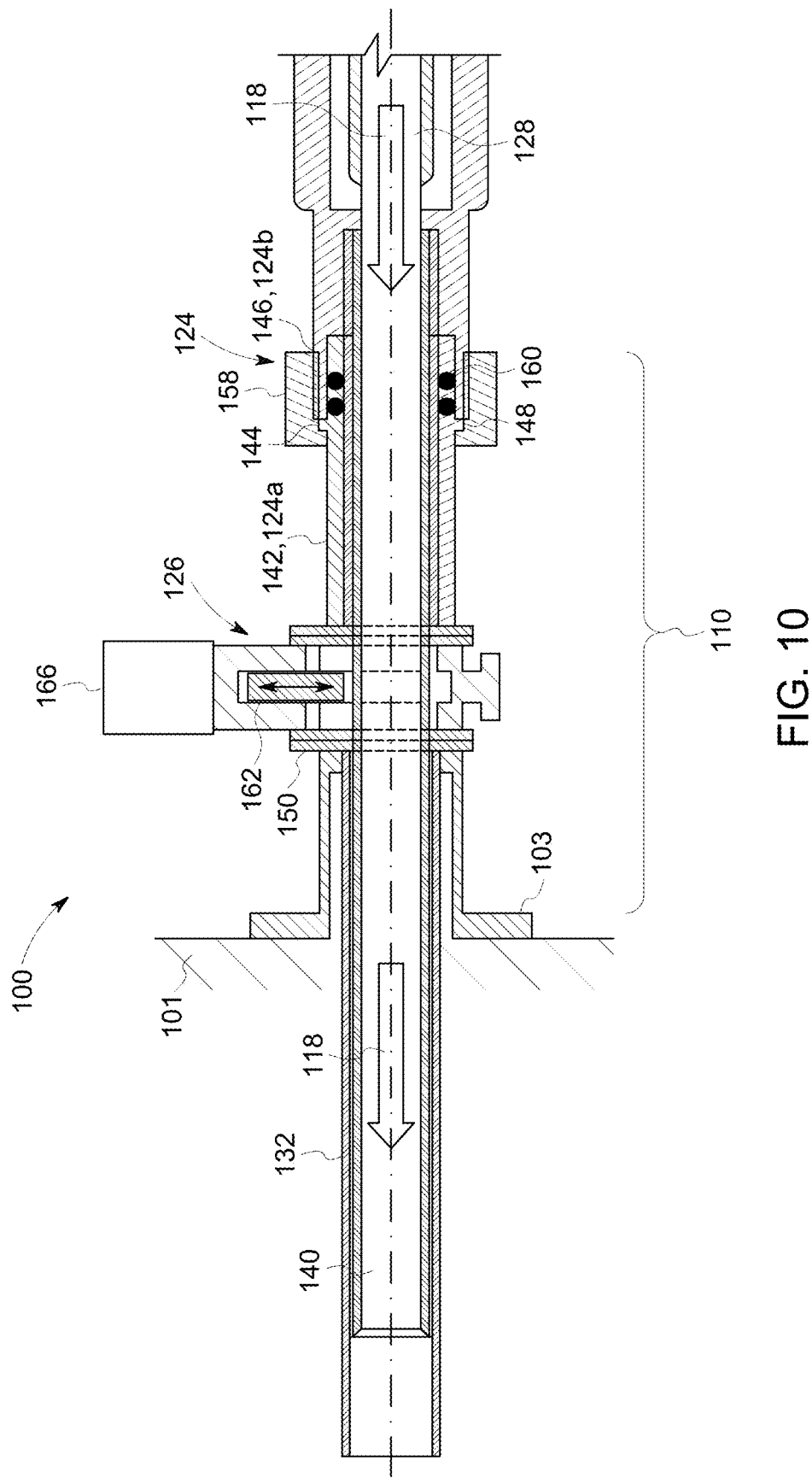
FIG. 10 is a schematic cross-sectional view of an alternate embodiment of a cryogenic transfer line coupling in an open position, in accordance with one embodiment of the present disclosure.

Referring now to FIGS. 4-10, illustrated are various schematic illustrations of a novel cryogenic transfer line coupling of FIGS. 1 and 2 as disclosed herein. More specifically, FIG. 4 is a schematic isometric view of a portion of the cryogenic transfer line coupling. FIG. 5 is an isometric view of the portion of the cryogenic transfer line coupling of FIG. 4 in an exploded view. FIG. 6 is a schematic elevation view of a portion of the cryogenic transfer line coupling of FIG. 4. FIG. 7 is a schematic side view of a portion of the cryogenic transfer line coupling of FIG. 4. FIG. 8 is a schematic cross-sectional view of the cryogenic transfer line coupling of FIG. 4 in an open position. FIG. 9 is a schematic cross-sectional view of the cryogenic transfer line coupling of FIG. 4 in a closed position and FIG. 10 is a schematic cross-sectional view of an alternate embodiment of a cryogenic transfer line coupling in an open position.

The cryogenic system 10 includes the cryostat 101, the cryogenic transfer line 128 penetrating the cryostat 101, a cryostat induction tube 132 welded to an entry flange, or plate, 103 of the cryostat 101 and into which the cryogenic transfer line 128 is at least partially disposed during use (described presently) and the cryogenic transfer line coupling 110, coupling the cryogenic transfer line 128 to the cryostat 101. In the illustrated embodiments, the cryogenic transfer line 128 is generally comprised of a tubular structure that extends axially into the cryostat induction tube 132 to penetrate the cryostat 101. The cryogenic transfer line coupling 110 provides coupling of the cryogenic transfer line 128 and the cryostat induction tube 132 to form a complete cryogenic transfer fluid path 140 for a cryogenic fluid 118.

As shown in FIG. 8, the cryogenic transfer line 128 is coupled to the cryostat 101 via a bayonet coupling, generally referenced 124. The cryogenic transfer line coupling 110 comprises a first portion 124a of the bayonet coupling 124, configured as an at least partially threaded female receptor 146 of the bayonet coupling 124. The cryogenic transfer line 128 has formed as a part thereof a second portion 124b of the bayonet coupling 124, configured as a generally cylindrical male portion 142, including one or more radial extending pins or protrusions, 144. Referring briefly to FIG. 10, in an alternate embodiment, the cryogenic transfer line coupling 110 comprises a first portion 124a of the bayonet coupling 124, configured as a generally cylindrical male portion 142 of the bayonet coupling 124, including one or more radial extending pins or protrusions 144. The cryogenic transfer line 128 has formed as a part thereof a second portion 124b of the bayonet coupling 124, configured as a female receptor 146.

During coupling of the cryogenic transfer line 128 to the cryostat 101, a generally nut-shaped component 158 of the cryogenic transfer line 128 is disposed relative to the female receptor 146, such as threaded thereon, to form one or more L-shaped slot(s) 148 into which the protrusions 144 are cooperatively engaged. In an embodiment, additional components, such as one or more springs (not shown) may further keep the cylindrical male portion 142 and the female receptor 146 locked together. The bayonet coupling 124 may further include one or more sealing components 160, such as one or more O-rings, providing further sealing engagement of the cylindrical male portion 142 and the female receptor 146. In another embodiment, the female receptor may include L-shaped slot(s) 148 into which the one or more radial protrusions of the cylindrical male side are engaged to keep the two parts locked together.

In the embodiment of FIGS. 4-9, the one or more cryogenic transfer line couplings 110 (of which only a single coupling is illustrated) comprises a first portion 124a of the bayonet coupling 124 and the gate valve 126. The bayonet coupling 124 includes the female receptor 146, as previously described, as a portion of the cryogenic transfer line coupling 110. A plurality of port flanges 150 are disposed relative to a port 164 formed therethrough the gate valve 126 to aid in coupling the gate valve 126 and the cryostat induction tube 132.

As previously indicated, the cryogenic transfer line coupling 110 further comprises the gate valve 126 disposed in fluid communication with the cryogenic transfer line 128 and provides for sealing of the cryogenic transfer fluid path 140 subsequent to the transfer of the cryogenic fluid 118, or cooldown, and disengagement of the cryogenic transfer line 128. As seen in FIG. 9, the gate valve 126, and more particularly, a gate valve plate 162, provides for sealing of the cryogenic circuit, and more particularly the cryostat induction tube 132, when the cryogenic transfer line 128 is disengaged from the cryostat 101.

In the embodiment of FIGS. 4-9, the gate valve 126 is communicatively coupled to and disposed between the bayonet coupling 124, and more particularly the female receptor 146 of the bayonet coupling 124, and the entry flange 103, to provide sealing of the cryostat induction tube 132, and the cryogenic circuit of the cryostat 101. The gate valve 126 prevents the ingress of environmental air 130 passing through the female receptor 146 of the bayonet coupling 124 to the cryogenic fluid 118 disposed within the cryostat 101 upon disengagement of the cryogenic transfer line 128 from the cryogenic transfer line coupling 110.

Referring more specifically to FIGS. 6 and 7, the gate valve 126 forms a portion of the cryogenic transfer line coupling 110 and is generally comprised of a case body 152, a body flange 154, a bonnet plate 156, and the port flange 150, disposed about an opening or the port 164. In addition, in an embodiment, the gate valve 126 may include an actuator and actuator housing, generally referenced 166, disposed relative thereto the gate valve 126. In an alternative embodiment, the gate valve 126 may be manually actuated, or actuated by alternative means. In the embodiment of FIG. 6, the gate valve 126 further includes the gate valve plate 162, moveable relative to the case body 152, and actuated via the actuator 166, to provide sealing of the opening or port 164. The gate valve plate 162 is shown partially closed in FIG. 6.

Subsequent to the transfer of cryogenic fluid 118, the gate valve 126 is closed, so as to close off and seal the cryogenic circuit within the cryostat 101 from the environment, and ingress of environmental air, prior to disengagement of the cylindrical male portion 142 of the bayonet coupling 124 of the cryogenic transfer line 128. Due to the cryogenic circuit being closed to the environment, air ingress into to the cryogenic circuit does not occur.

By way of example, in the disclosed embodiments, the cryogenic transfer line 128 may comprise a cylindrical tube having a thin-walled circular cross-section, referred to herein as a thin-walled tube. Furthermore, in certain embodiments, the cryogenic transfer line 128 is a thin-walled stainless steel tube.

It may be noted that the cryogenic fluid may include liquid helium, liquid hydrogen, liquid neon, liquid nitrogen, or combinations thereof. When engaged via the cryogenic transfer line coupling 110, the cryogenic transfer line 128 is in operative association with the cryogenic fluid 118 disposed within the cryogenic vessel 104 of the cryostat 101, and thus coupled to a low temperature region. The low temperature region may be at a temperature in a range from about 4 degrees K to about 80 degrees K based on the cryogenic fluid in use, in certain applications. By way of example, if the cryogenic fluid is liquid hydrogen, then the lower temperature region may be at a temperature of about 20 degrees K. Also, if the cryogenic fluid is liquid neon, then the lower temperature region may be at a temperature of about 27 degrees K. In addition, for other cryogens, the lower temperature region may be at a temperature in a range from about 4 degrees K to about 80 degrees K.

As will be appreciated, in the case that helium is used as the cryogenic fluid 118 there exists a temperature gradient from about 4 degrees K to about 300 degrees K across the length of the cryogenic transfer line coupling 110 during normal operation of the cryostat 101. However, during the transfer of cryogenic fluid 118, or cooldown, this temperature gradient fades and consequently there is a substantially uniform temperature across a complete axial length of the cryogenic transfer line coupling 110 and cryogenic transfer line 128, thereby reducing the temperature of the cryogenic transfer line coupling 110 to a range from about 5 degrees K to about 15 degrees K. To address the stress and strain in the cryogenic transfer line coupling 110, the transfer line coupling 110 is configured to compensate for any shrinkage of the transfer line coupling 110 or the cryogenic transfer line 128 during the transfer of cryogenic fluid 118 or cooldown. More specifically, components of the transfer line coupling 110 are configured to expand and/or contract during or subsequent to the transfer of cryogenic fluid or cooldown, thereby compensating for changes to the components of the transfer line coupling 110 during the transfer of cryogenic fluid 118 or cooldown and substantially minimizing axial stress concentrations within the transfer line coupling 110.

Furthermore, it may be noted that the use of the gate valve 126 aids in hermetically closing, or sealing off of the cryogenic vessel 104 during disengagement of the cryogenic transfer line 128, and more particularly, during disengagement of the cryogenic transfer line 128 via the bayonet coupling 124. The complete sealing of the cryogenic vessel 104 by employing the gate valve 126 in the cryogenic transfer line coupling 110, as opposed to leaving the cryogenic circuit open to the ingress of environmental air, aids in the reduction of heat load caused by the ingress of environmental air during disengagement of the cryogenic transfer line 128. Air ingress into a tube for example leads to ice ring formation within the cryogen tubing that can initiate thermoacoustic oscillations within the tubing resulting in high parasitic heat loads to the cryostat. By way of example, based on the design of the cryogenic transfer line coupling 110, a reduction in the total thermal cryogenic budget in a range from about 50 mW to 150 mW can be achieved.

The various embodiments of the exemplary cryogenic transfer line assembly and cryogenic transfer line coupling configured for use in a cryostat described hereinabove dramatically reduces the ingress of environmental air into the cryogenic circuit subsequent to cryogenic fluid transfer or cooldown, and thus the heat load to the cryostat typically caused during the disengagement of the cryogenic transfer line. The lower thermal burden on the cryostat, and more particularly the cryogenic circuit, advantageously results in increasing the ride-through time, extending coldhead service time, and cost saving. By way of example, the simplified design of the cryogenic transfer line coupling reduces the cost of the overall system. The low heat load to the cryostat resulting from the use of the exemplary cryogenic transfer line coupling(s) described hereinabove potentially aids in reducing the total helium inventory required in a cryostat. The various embodiments of the cryogenic transfer line coupling described hereinabove therefore present a heat load optimized cryogenic circuit, which is a key factor for successful cryostat design.

The various embodiments of the exemplary cryogenic transfer line coupling configured for use in a cryostat described hereinabove may be applicable to MRI systems. In addition, the various embodiments of the exemplary cryogenic transfer line coupling configured for use in a cryostat may be equally applicable to other related structures that require cooldown, e.g. superconducting wind applications, superconducting electrical aircraft applications, as well as for cold mass cooldown in lab test dewars.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A cryogenic transfer line coupling for a cryostat, the cryogenic transfer line coupling comprising:
   a first portion of a bayonet coupling; and
   a gate valve communicatively coupled to the first portion of the bayonet coupling and operable to provide sealing of an opening therethrough the gate valve and prevent the ingress of environmental air passing through the first portion of the bayonet coupling to a cryogenic fluid disposed within a cryogenic vessel of the cryostat.

2. The cryogenic transfer line coupling of claim 1, wherein the first portion of the bayonet coupling is communicatively coupled to a second portion of the bayonet coupling.

3. The cryogenic transfer line coupling of claim 2, wherein the second portion of the bayonet coupling is formed on an end of a cryogenic transfer line to define a cryogenic fluid flow path.

4. The cryogenic transfer line coupling of claim 3, wherein the gate valve is operable to seal a cryogenic circuit of the cryostat from the ingress of environmental air passing through the first portion of the bayonet coupling to the cryogenic fluid disposed within the cryogenic vessel of the cryostat upon disengagement of the second portion of the bayonet coupling from the first portion of the bayonet coupling.

5. The cryogenic transfer line coupling of claim 1, wherein the first portion of the bayonet coupling is a female receptor of the bayonet coupling.

6. The cryogenic transfer line coupling of claim 1, wherein the first portion of the bayonet coupling is a male portion of the bayonet coupling.

7. The cryogenic transfer line coupling of claim 1, wherein the cryogenic fluid comprises liquid helium, liquid hydrogen, liquid neon, liquid nitrogen, or combinations thereof.

8. A cryogenic transfer line assembly for a cryostat comprising:
   an induction tube communicatively coupled to the cryostat;
   a cryogenic transfer line having defined as a portion thereof a second portion of a bayonet coupling, at least a portion of the cryogenic transfer line disposed within the induction tube; and
   a cryogenic transfer line coupling, wherein the cryogenic transfer line coupling communicatively couples the induction tube and the cryogenic transfer line and having defined as a portion thereof a first portion of the bayonet coupling and a gate valve to provide sealing of an opening therethrough the gate valve and prevent the ingress of environmental air passing through the first portion of the bayonet coupling to a cryogenic fluid disposed within a cryogenic vessel of the cryostat upon disengagement of the cryogenic transfer line from the cryogenic transfer line coupling.

9. The cryogenic transfer line assembly of claim 8, wherein the first portion of the bayonet coupling is a female receptor of the bayonet coupling.

10. The cryogenic transfer line assembly of claim 8, wherein the first portion of the bayonet coupling is a male portion of the bayonet coupling.

11. The cryogenic transfer line assembly of claim 8, wherein the first portion of the bayonet coupling is communicatively coupled to the second portion of the bayonet coupling.

12. The cryogenic transfer line assembly of claim 11, wherein the second portion of the bayonet coupling is formed on an end of the cryogenic transfer line.

13. The cryogenic transfer line assembly of claim 12, wherein the gate valve is operable to seal a cryogenic circuit of the cryostat from the ingress of environmental air passing through the second portion of the bayonet coupling to a cryogenic fluid disposed within the cryogenic vessel of the cryostat upon disengagement of the second portion of the bayonet coupling from the first portion of the bayonet coupling.

14. The cryogenic transfer line assembly of claim 8, wherein the cryogenic transfer line coupling is coupled to the cryostat at a first end and the cryogenic transfer line at an opposed second end.

15. The cryogenic transfer line assembly of claim 8, wherein the cryogenic fluid comprises liquid helium, liquid hydrogen, liquid neon, liquid nitrogen, or combinations thereof.

16. A cryogenic system, comprising:
   a superconducting magnet;
   a cryostat comprising a cryogenic vessel in which the superconducting magnet and a cryogenic fluid are contained; and
   a cryogenic transfer line assembly communicatively coupled to the cryostat, wherein the cryogenic transfer line assembly comprises:
      an induction tube communicatively coupled to the cryostat;
      a cryogenic transfer line having defined as a portion thereof a second portion of a bayonet coupling, at least a portion of the cryogenic transfer line disposed within the induction tube; and
      a cryogenic transfer line coupling, wherein the cryogenic transfer line coupling communicatively couples the induction tube and the cryogenic transfer line, wherein the cryogenic transfer line coupling comprises:
         a first portion of the bayonet coupling; and
         a gate valve.

17. The cryogenic system of claim 16, wherein the first portion of the bayonet coupling is communicatively coupled to the second portion of the bayonet coupling formed on an end of the cryogenic transfer line.

18. The cryogenic system of claim 16, wherein the gate valve is disposed between the second portion of the bayonet coupling and the cryostat.

19. The cryogenic system of claim 18, wherein the gate valve is operable to seal a cryogenic circuit of the cryostat from the ingress of environmental air passing through the first portion of the bayonet coupling to the cryogenic fluid disposed within the cryogenic vessel of the cryostat upon disengagement of the second portion of the bayonet coupling and the first portion of the bayonet coupling.

20. The cryogenic system of claim 16, wherein the cryogenic fluid comprises liquid helium, liquid hydrogen, liquid neon, liquid nitrogen, or combinations thereof.

* * * * *